(12) United States Patent
Casarsa

(10) Patent No.: US 8,099,640 B2
(45) Date of Patent: Jan. 17, 2012

(54) SHARED DIAGNOSIS METHOD FOR AN INTEGRATED ELECTRONIC SYSTEM INCLUDING A PLURALITY OF MEMORY UNITS

(75) Inventor: Marco Casarsa, Milan (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 80 days.

(21) Appl. No.: 12/549,747

(22) Filed: Aug. 28, 2009

(65) Prior Publication Data

US 2010/0058128 A1    Mar. 4, 2010

(30) Foreign Application Priority Data

Aug. 29, 2008   (IT) .............................. MI2008A1561

(51) Int. Cl.
*G11C 29/00* (2006.01)
*G11C 7/00* (2006.01)
(52) U.S. Cl. ........................................ 714/723; 365/201
(58) Field of Classification Search .................. 714/718, 714/719, 723; 365/201
See application file for complete search history.

(56) References Cited

U.S. PATENT DOCUMENTS

| | | | |
|---|---|---|---|
| 5,892,721 A | 4/1999 | Kim ............................... | 365/201 |
| 6,523,135 B1 * | 2/2003 | Nakamura ...................... | 714/30 |
| 7,607,060 B2 * | 10/2009 | Gorman et al. ................ | 714/733 |
| 2004/0085836 A1 | 5/2004 | Lee ................................ | 365/201 |
| 2004/0128596 A1 * | 7/2004 | Menon et al. ................... | 714/724 |
| 2008/0082883 A1 | 4/2008 | Gorman et al. ................ | 714/733 |

OTHER PUBLICATIONS

Lines et al. "A 1GHz embedded DRAM macro and fully programmable BIST with at-speed bitmap capability," Memory Technology, Design, and Testing, 2005. MTDT 2005. 2005 IEEE International Workshop on , vol., no., pp. 47-51, Aug. 5-5, 2005 doi: 10.1109/MTDT.2005.5 URL: http://ieeexplore.ieee.org/stamp/stamp.jsp?tp=&arnumber=1498202&isnumber=32177.*

Mukherjee, N.; Pogiel, A.; Rajski, J.; Tyszer, J.; , "High Throughput Diagnosis via Compression of Failure Data in Embedded Memory BIST," Test Conference, 2008. ITC 2008. IEEE International , vol., no., pp. 1-10, Oct. 28-30, 2008 doi: 10.1109/TEST.2008.4700554 URL: http://ieeexplore.ieee.org/stamp/stamp.jsp?tp=&arnumber=4700554&isnumber=4700527.*

Chen, J.T.; Khare, J.; Walker, K.; Shaikh, S.; Rajski, J.; Maly, W.; , "Test response compression and bitmap encoding for embedded memories in manufacturing process monitoring," Test Conference, 2001. Proceedings. International , vol., no., pp. 258-267, 2001doi: 10.1109/TEST.2001.966641.*

* cited by examiner

*Primary Examiner* — Cynthia Britt
(74) *Attorney, Agent, or Firm* — Lisa K. Jorgenson; Allen, Dyer, Doppelt, Milbrath & Gilchrist, P.A.

(57) ABSTRACT

A shared diagnosis method may be for an electronic integrated system embedding a plurality of memory units associated with Built In Self Test (BIST) hardware portions for executing a test on memory locations of the memory units. A FAIL signal may be provided from the hardware portions, together with the memory locations of the memory units on which the test is executed. The method may include loading of address, state and data signals, generated during the test on the memory locations, in a series of bitmapping registers and supplied by multiplexer devices, which receive as inputs the address, state, and data signals from the memory units and from the hardware portions. The enabling for the loading of the bitmapping registers is through the processing of a Fail signal in a counter supplied by a multiplexer device receiving the Fail signals from the hardware portions.

19 Claims, 2 Drawing Sheets

SHARED DIAGNOSIS METHOD FOR AN INTEGRATED ELECTRONIC SYSTEM INCLUDING A PLURALITY OF MEMORY UNITS

FIELD OF THE INVENTION

The present invention relates to a shared diagnosis method for an integrated electronic system embedding a plurality of memory units associated with Built In Self Test (BIST) hardware portions suitable for executing tests on the memory locations of the memory units, and wherein a FAIL signal is provided in output from the hardware portions, together with the locations of the memory units whereon the test is executed. The invention also relates to an architecture of an integrated electronic system embedding a plurality of memory units associated with a BIST hardware portion suitable for executing tests on the memory locations of the units and wherein a FAIL signal is provided in output from the hardware portions together with the locations of the memory units whereon the test is executed.

BACKGROUND OF THE INVENTION

At present, the prior art provides some approaches for trying to meet the previously described needs. For example a first approach may be identified as Static Bit-mapping. Briefly, memory locations under failure are identified by reading the data stored in these memory locations, and by comparing this data with the expected values.

More particularly, this type of bitmapping allows downloading of the read data in a sequential way and comparing them with the expected values through an exclusive OR (EX-OR) operation at all the times that a memory location is accessed, and also if the read datum is equivalent to the expected one. In this case, the scanning BIST algorithm interrupts the scanning of the volatile memory while an external pin of the device is serially provided with the data compared in the EX-OR for comparison with the expected values.

This approach may be able to identify only static failures since the sequential access to the memory locations does not occur at the nominal working frequency, but is interrupted by the serial downloads. A second approach is Bitmapping on error. This second approach may be considered as a first in, first out (FIFO) structure for identifying the failure state.

According to this type of bitmapping, the read data may be serially downloaded only in case of a failure. Typically, there is a structure of FIFO registers with N stages to collect, at the same memory working speed and the nominal frequency, the failure states, and thus prevent the execution of the BIST algorithm of the RAM devices from being interrupted in case of consecutive multiple errors. The single stage of the FIFO structure is serially downloaded.

This architecture has the advantage of executing a bitmapping at the nominal frequency in case of consecutive failures and if the FIFO structure is not filled, i.e. in case an overflow in the FIFO structure does not occur. However, there are several drawbacks which limit the application of this diagnosis method.

For example, in case of filling of the FIFO structure, the failures detected are mixed (static/dynamic). In fact, when an overflow occurs, the sequential access to the memory is suspended until at least one register or stage of the FIFO structure is freed. Moreover, the tester should dynamically synchronize the download of the data since the failures are not deterministic, just like the flow of the data being output. Thus, it may be difficult to define the depth of the FIFO structure since a high number of registers or stages increases the occupied area even if it improves the possibility of executing a diagnosis at the same working speed of the memory device. In other words, if the FIFO structure is full, it may be impossible to detect failures of dynamic transitions.

The technical problem is that of providing a shared diagnosis method of the BIST algorithm for random access volatile memory devices having such features as to allow a dynamic bitmapping, overcoming, at the same time, the limits of the approaches already provided by the prior art.

SUMMARY OF THE INVENTION

The purpose of the present embodiments is that of providing a diagnosis method and a corresponding hardware architecture for executing a diagnosis, on-line and off-line, of a volatile memory embedded in a more complex System on Chip architecture and for providing an approach which is enhanced in terms of area occupation with respect to the diagnosis approaches at present provided by the prior art.

As it is well known in this specific technical field the need is felt for investigating and discovering failed locations of the volatile memory units after manufacturing or also after marketing thereof. There is the pressing demand by several technological sectors for hardware architectures to be intrinsically provided with diagnostics for providing information for easily discovering failed physical locations (both static and dynamic) in case of post marketing problems, or problems due to goods given back by clients. These hardware architectures should be realized by reducing, as much as possible, the circuit area globally occupied by the memory device or in the System on Chip, wherein the memory device is embedded.

The above need is mainly due to the fact that a possible recurring failure situation should be clearly identified first of all to address possible technical and design problems which, in manufacturing, lead to the failure situation. Moreover, in case of failures detected after the marketing of the good, there may be the further need of understanding if the failure situation is due to the device user's modes.

The approach of the present embodiments is that of executing a diagnosis on a plurality of memory units by using signals acquired through BIST hardware. The BIST hardware may be associated with respective memory units, thus supplying, with these signals, a diagnosis logic shared by all the memory units, intended for signalling, in real time, the failure of a reading operation, thus optimizing the increase of the silicon area controlling the diagnosis.

These signals may include a FAIL signal provided at a high level at the output of modern BIST hardware of the memory units. In particular, the FAIL signal may not have to be particularly quick but, as generally provided by BIST hardware architectures, the signal may, for example, flow in a pipeline.

Moreover, in case the FAIL signal cannot be acquired directly through the Fail pin, it is however possible to execute the method by recovering the signal from the BIST hardware. In fact, this BIST hardware uses, inside, a flag signal, corresponding to the FAIL signal, and thus a modification in the coding of the BIST hardware is enough to update some interface signals and to obtain the flag signal. According to the above approach, the technical problem is addressed by a shared diagnosis method as defined in Claim 1 and in the following claims.

Based upon the present embodiments, there is also the idea of sharing a diagnosis architecture including a plurality of bitmapping registers, of pipeline registers, and of failure counters by all the different BIST hardware portions and the corresponding memory units. Advantageously, the diagnosis method and the corresponding architecture use the signals generated by the BIST hardware for testing the memory units to execute a diagnosis of the failures in the respective memory units, thus optimizing the silicon area for executing the diagnosis. The characteristics and the advantages of the diagnosis method should be apparent from the following description of an embodiment given by way of an indicative and non-limiting example with reference to the annexed drawings.

DETAILED DESCRIPTION OF THE PREFERRED EMBODIMENTS

Figure 1:
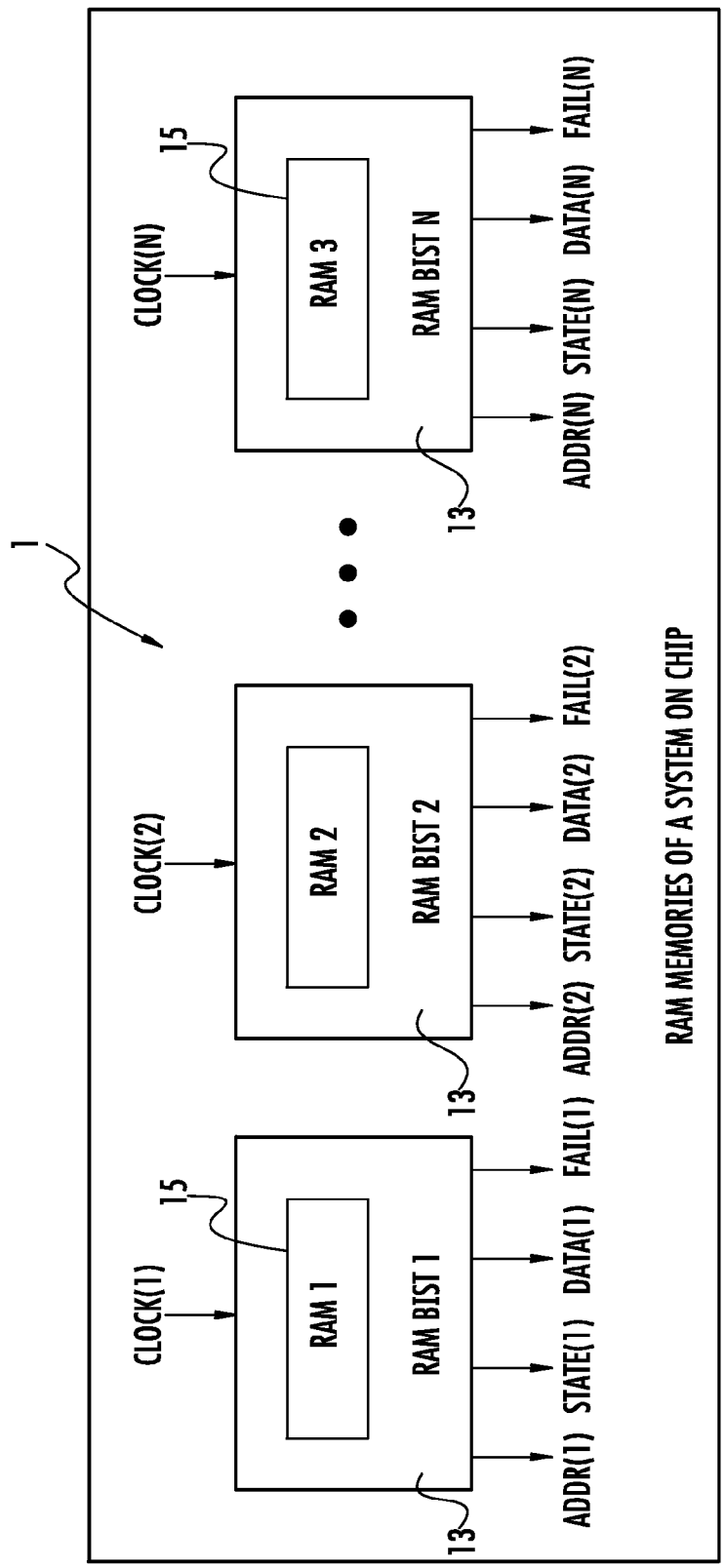
FIG. 1 shows a schematic view of a System on Chip embedding a plurality of volatile memory devices and of the corresponding BIST, according to the prior art.

With reference to these figures, and in particular to the example of FIG. 1, an integrated electronic device architecture, for example, the System on Chip type, embedding a plurality of N, structurally independent, memory units 15 is globally and schematically indicated with 1. The memory units 15 are associated with Built In Self Test (BIST) hardware portions 13, which are used for testing the memory units 15. In particular, with reference to FIG. 1 and without limiting the area of application, each memory unit 15 may be associated with a corresponding hardware portion 13 of the BIST type. The memory units 15 may be random access memories, for example, random access memory (RAM), may be integrated in the architecture 1 of the System on Chip.

The BIST hardware portion 13, according to a known technique, executes a test of the memory locations of a corresponding memory unit 15, sending data and address signals to the data and the addresses of the memory unit 15, controlling the data output from this memory unit, and generating a fail signal if the output data are different from the expected data. In particular, a state signal is generated by the BIST hardware portion 13 which indicates the state in which the fail signal has been generated.

Figure 2:
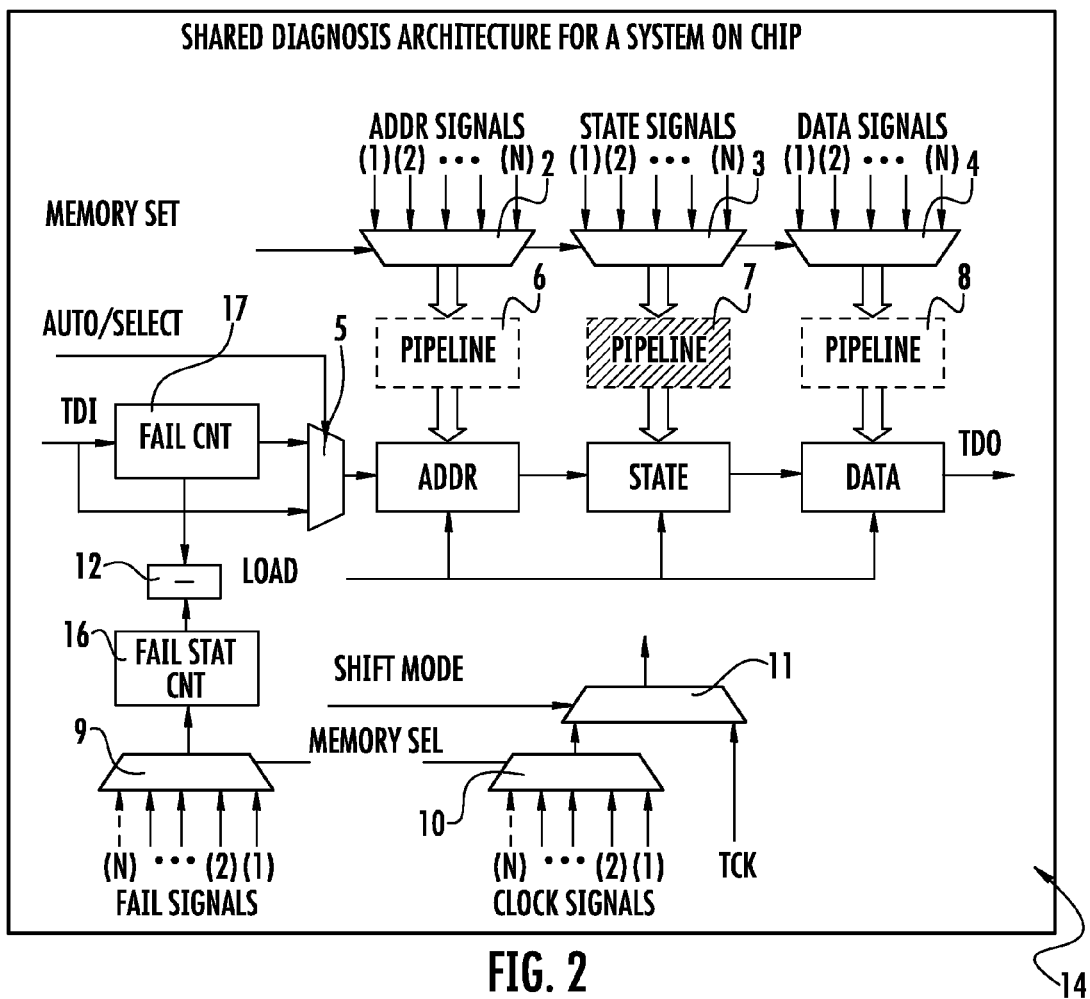
FIG. 2 shows a schematic view of a hardware architecture for the implementation of a shared diagnosis method, according to the present invention.

For example, the hardware portion 13 may be implemented as a finite state machine, in which each stage provides for sending data and executing a specific operation, for example, a reading or writing operation on the memory unit. From each hardware portion 13 controlling the BIST and from the respective memory units 15 the following signals originate: ADDR, STATE, DATA, and FAIL. A further circuit portion 14, shown in detail in FIG. 2, is for receiving, as inputs, the Data ADDR, STATE, DATA, and FAIL signals for executing the diagnosis method. The circuit portion 14 is embedded and integrated inside the System on Chip 1.

In essence, FIG. 2 no longer shows the memory units 15 and the corresponding BIST hardware 13 wherefrom the ADDR, STATE, DATA, and FAIL signals originate, but the circuit portion 14 is schematically shown where the signals are transferred to BUS connections for being used for the diagnosis method. In particular, the State signal indicates the internal state of the portion 13 controlling the BIST and serves to indicate which phase or step of the algorithm the problem highlighted by the FAIL signal has occurred.

The circuit portion 14 includes multiplexer devices 2, 3 and 4, whereto all the address ADDR(1) . . . ADDR(N), state STATE(1) . . . STATE(N), and data DATA(1) . . . DATA(N) signals may be withdrawn from each BIST 13 are respectively connected.

In another embodiment, each one of the multiplexer devices 2, 3 and 4 may include a number of inputs N equal to the number of the memory units 15 and corresponding BIST 13.

However, since, according to some known architectures, a single BIST hardware 13 is shared by more memory units 15, the ADDR and STATE signals can be shared, and the FAIL and DATA signals can be distinguished. In this case the number of inputs N of the multiplexer devices 2, 3 and 4 is different from the number of the memory units 15 and corresponding BIST hardwares 13.

The single multiplexer devices 2, 3 and 4 are selected by a BUS Memory Sel applied on a suitable BUS, as schematically shown in FIG. 2. The first multiplexer 2 thus receives the address signals, the second multiplexer 3 receives the state signals, and the third multiplexer 4 receives the data signals from each memory unit 15 and from the corresponding BIST 13.

Advantageously, the circuit portion 14 controlling the diagnosis method is independent from the physical structure of the memory units 15 and of the BIST 13, and thus independent from the architecture of the memory units 15 and/or from the number of memory units 15 and of the respective BIST hardwares 13. In fact, the multiplexer devices 2, 3 and 4 form an interface between the circuit portion 14, the memory units 15, and the corresponding BIST 13 of the System on Chip 1.

The circuit portion 14 also may include bitmapping registers, which are identified in FIG. 2 with the references ADDR, STATE and DATA, and are dedicated to the corresponding address, state and data signals output from the memory units 15. These registers may be connected to one another in cascade, and the output of the DATA register issues a TDO signal. Advantageously, the TDO signal may be compatible with the standard protocol, IEEE 1149.1 Joint Test Action Group (JTAG).

The JTAG protocol may also relate to the inputs, and not only to the outputs. Moreover, the approach of adopting the JTAG protocol is one of the possible choices, but also dedicated pads for other functions of the device may be adopted for the purpose.

Optionally, between the output of each multiplexer 2, 3 or 4 and each corresponding bitmapping register, a delay block or pipeline register may be provided. More particularly, a block or register 6 may be interposed between the multiplexer 2 and the register ADDR, a block or register 7 may be interposed between the multiplexer 3 and the register STATE, and a block or register 8, may be interposed between the multiplexer 4 and the register DATA. In this way it may be possible to put in phase with each other, the loading steps in the bitmapping registers ADDR, STATE, and DATA independently from the possible differences in the hardware of the BIST 13.

It may also be possible to execute diagnoses on Systems on Chip by embedding an amount of different memory units 15 or memory units 15 having different architectures or BIST hardwares 13 with different architectures, since the circuit portion 14 can be adapted to these different architectures. Also the pipeline registers 6, 7 and 8 may be more than one, for example chains of pipelines with more stages. Moreover, they may be activated or bypassed according to the timing of the corresponding BIST so as to put the diagnosis signals on the bitmapping registers ADDR, STATE, and DATA in phase.

This configurability of the pipeline registers 6, 7 and 8 is advantageous, since different BIST hardware 13, associated with respective memory units 15, may have different timings in the generation of the ADDR, STATE, and DATA signals. The selection of these stages is in practice generally always controlled by the Memory Sel Selection BUS.

In the circuit portion 14 failure state counters Fail Cnt 17 and Fail Stat 16 are provided and are arranged upstream of the bitmapping registers ADDR, STATE, and DATA, and are respectively enabled by corresponding signals TDI and FAIL, as shown in FIG. 2.

Similar to what has already been described with reference to the multiplexer devices 2, 3 and 4, in the circuit portion 14 further multiplexer devices 9 and 10 are provided, respectively receiving at the input the N Fail signals, which output from the hardware portions 13 of the BIST and the N Clock signals applied to these hardware portions 13. Also these two multiplexers may be selected by the Memory Sel Selection BUS.

The output of the multiplexer 9 is applied to the counter 16 whose output is processed by a loading block 12 of the bitmapping registers ADDR, STATE, and DATA, indicated in FIG. 2 also as block LOAD 12. In particular, the loading block also receives, at the input, the output of the counter Fail Cnt 17 to output a control signal LOAD that may be applied to all the bitmapping registers ADDR, STATE and DATA.

This loading block 12 controls the value which output from the counters 16, 17 so that it is equal for then applying a corresponding control pulse represented by the LOAD signal to the bitmapping registers ADDR, STATE, and DATA.

The purpose of the loading block 12 is for activating the LOAD signal to store the ADDR, STATE, and DATA data in the corresponding bitmapping registers ADDR, STATE, and DATA.

The output of the counter Fail Cnt 17 is applied to a multiplexer 5 receiving also the TDI signal derived from the input of the same counter Fail Cnt 17. This multiplexer 5 is enabled by an Auto/Select signal that will be discussed hereafter.

Advantageously, the signal TDI may be compatible with the standard protocol IEEE 1149.1 JTAG, while the signal FAIL may be given by the output of the multiplexer 9 as a selection of the plurality of Fail signals of the memory units 15.

In substance, the memory sel BUS may allow the selection of all the corresponding inputs coming from the memory units 15 and from the corresponding hardware portions 13 controlling the BIST so that the BIST algorithm, according to the function of the value of the Memory Sel BUS, generates a pulse which is transmitted to the counter Fail Stat Cnt 17.

The diagnosis structure, i.e. the bitmapping registers ADDR, STATE, and DATA, the pipeline registers 6, 7, 8 and the failure counters 17 and 16, Fail Cnt and Fail Stat Cnt, is shared with all the different hardware portions BIST 13 and the corresponding memories 15. In this way, the circuit area destined to the diagnosis logic may be considerably reduced.

The delay blocks or pipeline registers 6, 7, and 8 are indicated in FIG. 2 with dotted lines since they depend on the architecture of the circuitry controlling the BIST test step and also may not be desired. For example, the delay block 8 may be bypassed or omitted when the DATA signals, which are typically stored in long memory words which typically need a considerable area, are concatenated inside the portion 13 controlling the BIST. However, different structures and architectures of hardware portions 13 can be shared inside a same System on Chip 1. These approaches may all be managed according to the present embodiments since the pipeline registers 6, 7, and 8 can be used for some signals and/or bypassed for others, according to the value of the Memory Sel Selection BUS.

The circuit portion 14 includes a multiplexer 11, which receives the output of the multiplexer 10 and a clock signal TCK of the System on Chip 1, and may be compatible with the standard IEEE 1149.1. In particular, the multiplexer 10 selects the clock signal used by the memory units 15 and by the BIST 13 during the execution of the algorithm itself, and is used by the circuit portions, which include the pipeline registers 6, 7, 8, the bitmapping registers ADDR, STATE, DATA, the counter Fail Stat Cnt 16, and the loading block 12. A signal SHIFT MODE is applied for the enabling of the multiplexer 11. This signal is, for example, generated through the decoding of a private/public instruction JTAG when the state is Shift-DR, or is generated by a dedicated pads in case all the test signals (TDI, TDO, Shift-Mode, Memory Sel, etc.) are controlled by pads in a Standard mode dedicated test.

It is worth noting that the Memory Sel BUS may be applied to each multiplexer 2, 3 and 4, and also to the multiplexers 9 and 10. Moreover, the Memory Sel BUS allows the use of the pipeline registers 6, 7, and 8 for some signals, and their bypass for other signals. The memory sel BUS may allow the selection of all the corresponding inputs coming from the memory units 15 and from the corresponding hardware portions 13 controlling the BIST.

The operation of the method is now discussed. The first step includes selecting the failure location configuring the Auto/Select signal. In the case in which the Auto/Select signal is set in the Select mode and that the Fail Cnt register 17 has been loaded serially by using an interface based on the standard protocol IEEE 1149.1 JTAG (TDI, TDO, and TCK). A second step includes the selection of the memory unit 15 and of the corresponding BIST portion 13 to be analyzed, configuring the Memory Sel BUS to switch with the several multiplexers 2, 3, 4, 9 and 10, and the corresponding registers and pipeline stages 6, 7, 8 on the correct signals ADDR, STATE, DATA, FAIL and CLOCK. At this point, the BIST algorithm is enabled and started.

The state of the counter 17 has a starting value which depends on the selection mode of the functionality Auto/Select while the other register 16 is increased at any FAIL pulse. Before the BIST execution occurs, the starting value of the register 16 is 0. The value stored in this register is also zeroed any time the loading block 12 LOAD signal is activated. When the value of the two counters 16, 17 is identical, the loading block 12 loads the current values of the BUSes, ADDR, STATE, and DATA of the memory unit 15 currently selected in the bitmapping registers ADDR, STATE, and DATA.

More particularly, according to the method, when an error occurs during the execution of the algorithm and the value of the two counters 16, 17 is identical, the loading block 12 loads the current values of ADDR, STATE, and DATA of the memory unit 15 currently selected in the respective bitmapping registers ADDR, STATE, and DATA. At this point, the completion of the execution of the BIST algorithm can be awaited, and the mapping in the selected location can be serially downloaded through the JTAG protocol. The download operation may allow a new execution of the BIST algorithm, initializing the counter 16 so that the sequence can be applied again by selecting the desired localization mode of the failure states.

In the Select mode the desired value is loaded in the counter 17, while in the automatic mode Auto, the analysis is started from the location being successive with respect to that of the previous diagnosis. In particular, the counter 17 is increased automatically generally only when the Auto mode is selected.

Even more in particular, the Auto/Select signal does not only have the purpose of defining the behavior of the block 17, but also that of bypassing it according to the value it takes. If the value of the signal is Auto, the value of the counter 17 is automatically increased at the end of each BIST execution. In this case, the function of the multiplexer 5 of FIG. 2 is that of avoiding, during the download of ADDR, STATE, and DATA, block 17 from being serially loaded/downloaded.

If the signal takes the value Select, the value of the counter 17 is loaded serially. In this case, the function of the multiplexer 5 is that of allowing the download of the block 17 during the download of ADDR, STATE, and DATA, and of the value of the block 17.

An additional and easily associable functionality includes computing the possible failures of the BIST process by disabling the comparison in the block 12 between the signals, which output from the counters 16 and 17, and by providing a serial access to the counter 16. For the execution of this computation, a further counter can be used, or the counter Fail Cnt 16 may be used in a shared mode. When this mode has been selected, the BIST reaches the end without being interrupted. By serially downloading the Fail Stat Cnt register 16 with a JTAG or pads protocol, the total number of errors during the execution of the BIST itself is identified.

Moreover, with modes that can be easily understood by the technicians of the field, the approach allows to use the functionalities of the download of the block 12 also for programming the ADDR register instead of the counter 16. In other words, the trigger, which activates the LOAD signal, is not activated when the content of the Fail Cnt register 17 is identical to the content of the Fail Stat Cnt register 16, but as briefly described hereafter.

A register is loaded, in the mode already described for the Fail Stat Cnt register 16, for the storage of an address to be compared with the ADDR address. When the address in ADDR is greater than the value in the register, and the BIST generates a FAIL pulse, the LOAD signal is applied so that the signals ADDR, STATE, and DATA are sampled, as previously described.

Moreover, a second register may be loaded for the storage of the state and for its comparison with STATE. In other words, according to this embodiment, not only is the comparison between the address stored in the register and ADDR executed, but also a comparison between the state stored in the second register and STATE is also executed.

From the previous description, the method allows use of the memory units 15 and the corresponding portions 13 controlling the BIST, adding to them a more efficient diagnostics structure in terms of area and functionality, since it shares a plurality of bitmapping registers, of pipeline registers, and of failure counters among the different hardware portions BIST and the corresponding memory units 15. The whole structure may be based on the use of the FAIL signals, and may include a configurable pipeline architecture, which ends in the bitmapping register, which includes the registers ADDR, STATE, and DATA and is thus configurable on the number or architecture of the memory units 15, and of the corresponding BIST 13.

Advantageously, the diagnosis method uses the signals generated by the BIST hardware for the test of the memory units, so as to execute a diagnosis of the failures in the respective memory units, without increasing the silicon area for executing the diagnosis. Advantageously, the information on the failure states are captured by the bitmapping registers and transferred at the output in a shift-mode way. This information is made available through the standard protocol, for example, JTAG, or directly on the pads of the device.

The invention claimed is:

1. A shared diagnosis method for an electronic integrated system including a plurality of memory units and Built In Self Test (BIST) hardware for testing the plurality of memory units, the method comprising:
   executing a test of memory locations of the plurality of memory units to determine if a fail signal is to be provided as an output from the BIST hardware together with the memory locations of the memory units on which the test is executed;
   loading address, state, and data signals generated during the test into a plurality of bitmapping registers via multiplexer devices; and
   enabling loading of the bitmapping registers by processing fail signals in a counter via another multiplexer device receiving fail signals from the BIST hardware.

2. The method according to claim 1 further comprising comparing an output from the counter with an output from a second counter, the second counter supplied with a signal compatible with a desired protocol, wherein the enabling is activated when the output from the counter is equal to the output from the second counter.

3. An integrated electronic system comprising:
   a plurality of memory units;
   Built In Self Test (BIST) hardware for testing said plurality of memory units and configured to execute a test on memory locations of the plurality of memory units and wherein the BIST hardware is configured to provide a fail signal as an output together with the memory locations of the memory units on which the test is executed; and
   an additional circuit portion comprising
      first multiplexer devices each configured to receive as an input corresponding address, state, and data signals from the plurality of memory units and the BIST hardware,
   second multiplexer devices each configured to receive as an input corresponding fail and clock signals from the BIST hardware,
      bitmapping registers respectively coupled to a corresponding output of said first multiplexer devices, said bitmapping registers being coupled together for supplying as an output failure information, and
      at least one counter configured to count fail signals and being coupled to an output of one of said second multiplexer devices for providing an enabling signal for loading of said bitmapping registers.

4. The system according to claim 3, wherein said additional circuit portion further comprises a second counter supplied by a signal compatible with a desired protocol, and a loading unit receiving the outputs of said at least one counter and said second counter for generating the enabling signal if the output of said at least one counter is equal to the output of the second counter.

5. The system according to claim 4, wherein said additional circuit portion further comprises a chain register coupled between outputs of said first multiplexer devices and inputs of corresponding ones of said bitmapping registers.

6. The system according to claim 5, wherein said additional circuit portion further comprises another multiplexer device receiving a signal from said second counter and the signal compatible with a desired protocol supplied to the input of said second counter, the another multiplexer device for generating as an output a signal to be supplied to the input of a first register of said plurality of bitmapping registers.

7. The system according to claim 6, wherein said another multiplexer device receives at an input a select enabling signal, and wherein a value of said second counter is dependent upon a value of the select enabling signal.

8. The system according to claim 7, wherein said second counter value is incremented if the select enabling signal is set to an automatic mode value.

9. The system according to claim 7, wherein said at least one counter is incremented based upon each receipt of the fail signal.

10. The system according to claim 4, wherein the signal compatible with the desired protocol supplying said second counter, the signal supplying as an output the failure information, and the clock signal are received by dedicated pads in a standard modality test.

11. The system according to claim 3, wherein said first multiplexer devices are enabled by an enabling signal from a common selection bus.

12. The system according to claim 3, wherein said additional circuit portion is selectively configurable on at least one of said plurality of memory units and said BIST hardware portions.

13. An integrated electronic system comprising:

a plurality of memory units;

Built In Self Test (BIST) hardware for testing said plurality of memory units and configured to execute a test on memory locations of the plurality of memory units and wherein the BIST hardware is configured to provide a fail signal as an output together with the memory locations of the memory units on which the test is executed; and an additional circuit portion comprising first multiplexer devices each configured to receive as an input corresponding address, state, and data signals from the plurality of memory units and the BIST hardware, said first multiplexer devices being enabled by an enabling signal from a common selection bus, second multiplexer devices each configured to receive as an input corresponding fail and clock signals from the BIST hardware, bitmapping registers respectively coupled to a corresponding output of said first multiplexer devices, said bitmapping registers being coupled together for supplying as an output failure information, at least one counter configured to count fail signals and being coupled to an output of one of said second multiplexer devices for providing an enabling signal for loading of said bitmapping registers, a second counter supplied by a signal compatible with a desired protocol, and a loading unit receiving the outputs of said at least one counter and said second counter for generating the enabling signal if the output of said at least one counter is equal to the output of the second counter.

14. The system according to claim 13, wherein said additional circuit portion further comprises a chain register coupled between outputs of said first multiplexer devices and inputs of corresponding ones of said bitmapping registers.

15. The system according to claim 14, wherein said additional circuit portion further comprises another multiplexer device receiving a signal from said second counter and the signal compatible with a desired protocol supplied to the input of said second counter, the further another multiplexer device for generating as an output a signal to be supplied to the input of a first register of said plurality of bitmapping registers.

16. The system according to claim 15, wherein said another multiplexer device receives at an input a select enabling signal, and wherein a value of said second counter is dependent upon a value of the select enabling signal.

17. The system according to claim 16, wherein said second counter value is incremented if the select enabling signal is set to an automatic mode value.

18. The system according to claim 16, wherein said at least one counter is incremented based upon each receipt of the fail signal.

19. The system according to claim 13, wherein said additional circuit portion is selectively configurable on at least one of said plurality of memory units and said BIST hardware portions.

* * * * *

UNITED STATES PATENT AND TRADEMARK OFFICE
CERTIFICATE OF CORRECTION

| | |
|---|---|
| PATENT NO. | : 8,099,640 B2 |
| APPLICATION NO. | : 12/549747 |
| DATED | : January 17, 2012 |
| INVENTOR(S) | : Casarsa |

It is certified that error appears in the above-identified patent and that said Letters Patent is hereby corrected as shown below:

Column 10, Line 22    Delete: "further"

Signed and Sealed this
Twelfth Day of February, 2013

Teresa Stanek Rea
*Acting Director of the United States Patent and Trademark Office*